United States Patent
Emira et al.

(10) Patent No.: US 8,791,765 B2
(45) Date of Patent: Jul. 29, 2014

(54) FORCE-MODE DISTRIBUTED WAVE OSCILLATOR AND AMPLIFIER SYSTEMS

(75) Inventors: Ahmed Emira, Mission Viejo, CA (US);
Ahmet Tekin, Mission Viejo, CA (US);
Damir Ismailov, Houston, TX (US);
Suat Utku Ay, Moscow, ID (US)

(73) Assignee: Waveworks, Inc., Milpitas, CA (US)

( * ) Notice: Subject to any disclaimer, the term of this patent is extended or adjusted under 35 U.S.C. 154(b) by 32 days.

(21) Appl. No.: 12/930,201

(22) Filed: Dec. 31, 2010

(65) Prior Publication Data
US 2012/0169427 A1   Jul. 5, 2012

(51) Int. Cl.
*H03B 5/18* (2006.01)
*H03B 5/26* (2006.01)

(52) U.S. Cl.
CPC .................. *H03B 5/1852* (2013.01);
*H03B 5/26* (2013.01)
USPC ............ 331/96; 331/57; 331/99; 331/107 SL; 331/117 D; 331/173

(58) Field of Classification Search
USPC .............. 330/53, 286; 331/45, 46, 57, 96, 99, 331/107 DP, 107 SL, 117 D, 172, 173
See application file for complete search history.

(56) References Cited

U.S. PATENT DOCUMENTS

| | | | | |
|---|---|---|---|---|
| 2,497,854 A * | 2/1950 | Baller | | 331/56 |
| 4,086,543 A * | 4/1978 | Nigrin | | 330/287 |
| 4,625,733 A | 12/1986 | Saynajakangas | | |
| 5,561,398 A * | 10/1996 | Rasmussen | | 331/36 C |
| 5,592,126 A * | 1/1997 | Boudewijns et al. | | 331/45 |
| 6,802,811 B1 | 10/2004 | Slepian | | |
| 7,091,802 B2 * | 8/2006 | Ham et al. | | 333/246 |
| 7,156,809 B2 | 1/2007 | Quy | | |
| 7,181,505 B2 | 2/2007 | Haller et al. | | |
| 7,265,676 B2 | 9/2007 | Gordon et al. | | |
| 7,324,850 B2 | 1/2008 | Persen et al. | | |
| 7,395,117 B2 | 7/2008 | Mazar et al. | | |
| 7,400,257 B2 | 7/2008 | Rivas | | |
| 7,542,878 B2 | 6/2009 | Nanikashvili | | |
| 7,584,002 B2 | 9/2009 | Burnes et al. | | |
| 7,613,510 B2 | 11/2009 | Rentea et al. | | |
| 7,722,536 B2 | 3/2010 | Goodnow | | |
| 7,741,921 B2 | 6/2010 | Ismailov | | |
| 7,787,946 B2 | 8/2010 | Stahman et al. | | |
| 7,973,609 B2 * | 7/2011 | Ohara et al. | | 331/57 |
| 8,089,322 B2 * | 1/2012 | Beccue et al. | | 331/96 |
| 8,134,415 B2 * | 3/2012 | Wood | | 331/46 |
| 8,169,267 B2 * | 5/2012 | Le Grand De Mercey | | 331/57 |
| 8,179,208 B2 * | 5/2012 | Drost et al. | | 333/139 |
| 8,217,725 B2 * | 7/2012 | Kondou | | 331/57 |
| 2004/0032300 A1 * | 2/2004 | Joordens et al. | | 331/57 |
| 2007/0241826 A1 * | 10/2007 | Ueno | | 331/57 |
| 2008/0070599 A1 | 3/2008 | Apodaca et al. | | |

(Continued)

*Primary Examiner* — Levi Gannon
(74) *Attorney, Agent, or Firm* — Oktay Enterprises Int'l., LLC; Sevgin Oktay

(57) ABSTRACT

A Force-Mode Distributed Wave Oscillator (FMDWO) that provides accurate multiple phases of an oscillation, a Force Mode Distributed Wave Antenna as a radiating element, a Force-Mode Distributed Oscillator Amplifier (FMDOA) and an array of amplifiers capable of operating as a beam forming phased-array antenna driver. Two distinct force mode mechanisms, one delay-based and the other geometry-based, utilizing inverter amplifiers, inject an oscillation on independent conductor loops or rings via transmission lines forming a differential transmission medium for the oscillation wave. Once the oscillation wave is initiated through the forcing mechanisms, the oscillations continue uninterrupted independent of any external triggering.

20 Claims, 13 Drawing Sheets

(56) References Cited

U.S. PATENT DOCUMENTS

| | | |
|---|---|---|
| 2009/0157141 A1 | 6/2009 | Chiao et al. |
| 2009/0157147 A1 | 6/2009 | Cauller et al. |
| 2010/0117744 A1* | 5/2010 | Takinami et al. ............... 331/45 |
| 2010/0123523 A1* | 5/2010 | Walsworth et al. ....... 331/108 R |

* cited by examiner

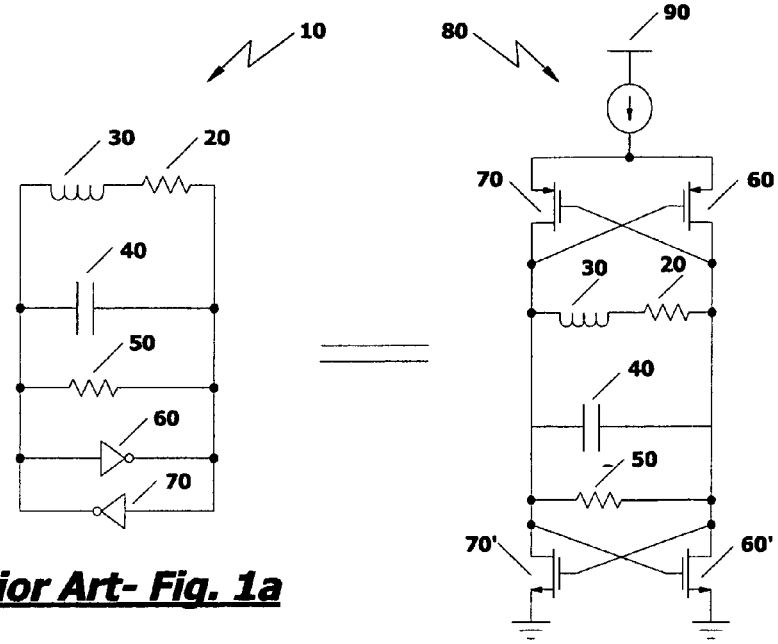
*Prior Art- Fig. 1a*
*Prior Art- Fig. 1b*
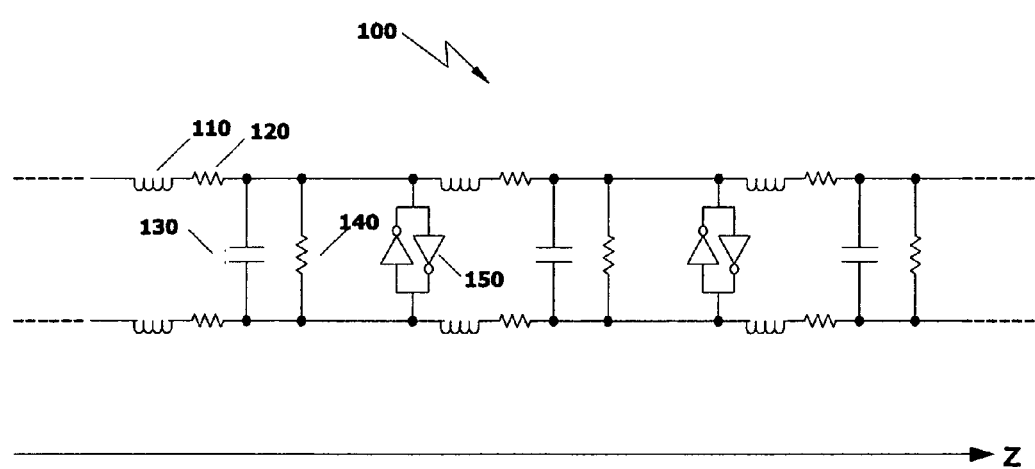
*Prior Art- Fig. 2*

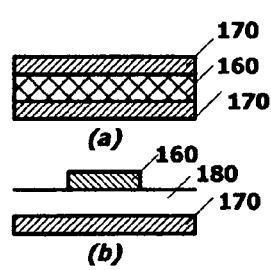
*Prior Art- Fig. 3*
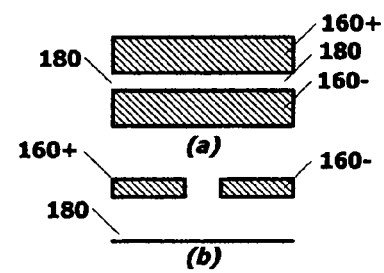
*Prior Art- Fig. 4*
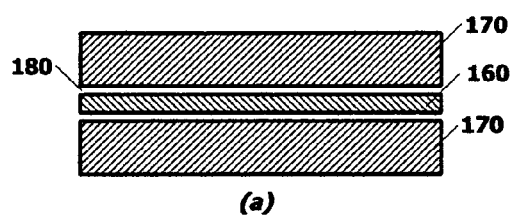
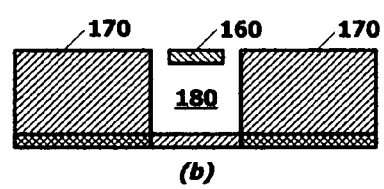
*Prior Art- Fig. 5*
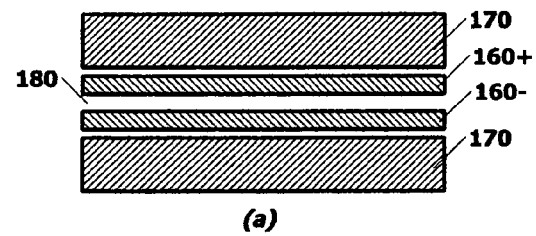
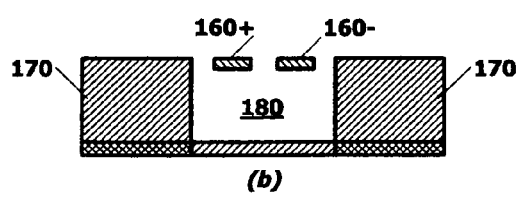
*Prior Art- Fig. 6*

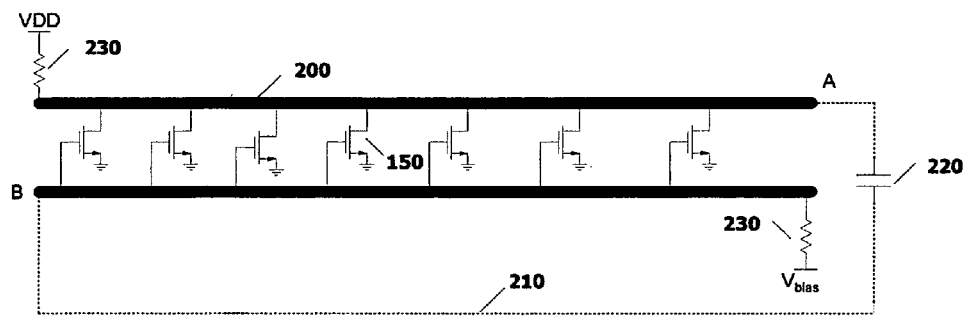
Prior Art- Fig. 7
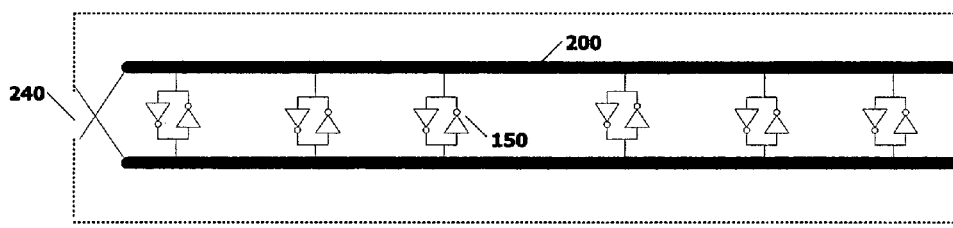
Prior Art- Fig. 8
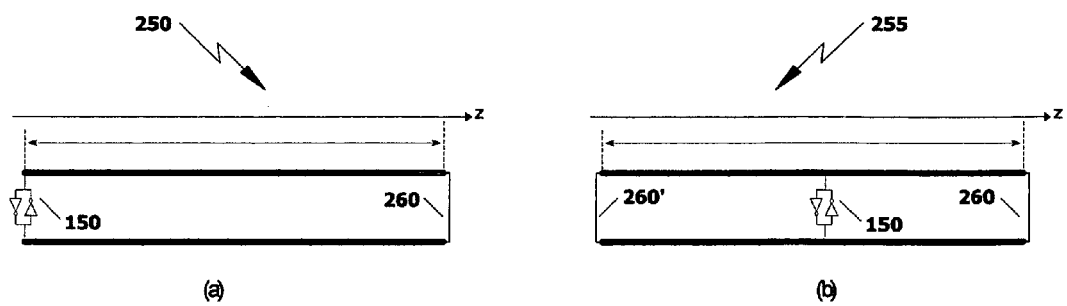
Prior Art- Fig. 9

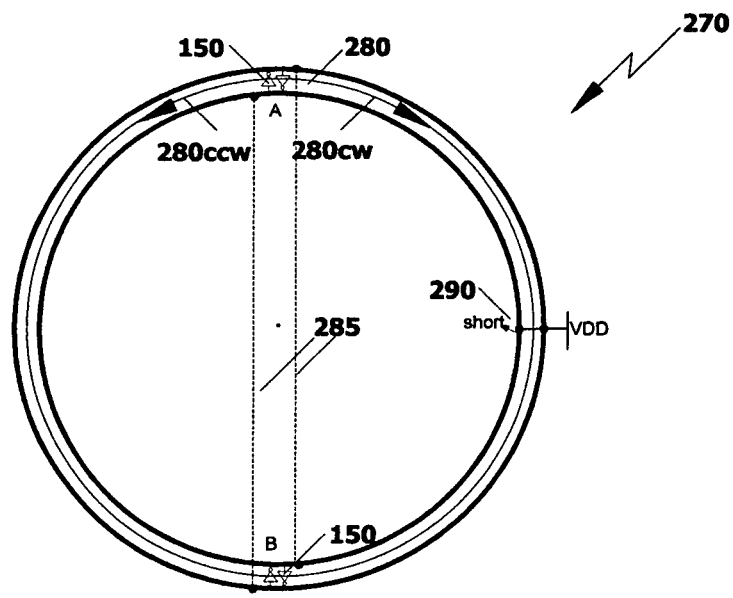
*Prior Art- Fig. 10a*
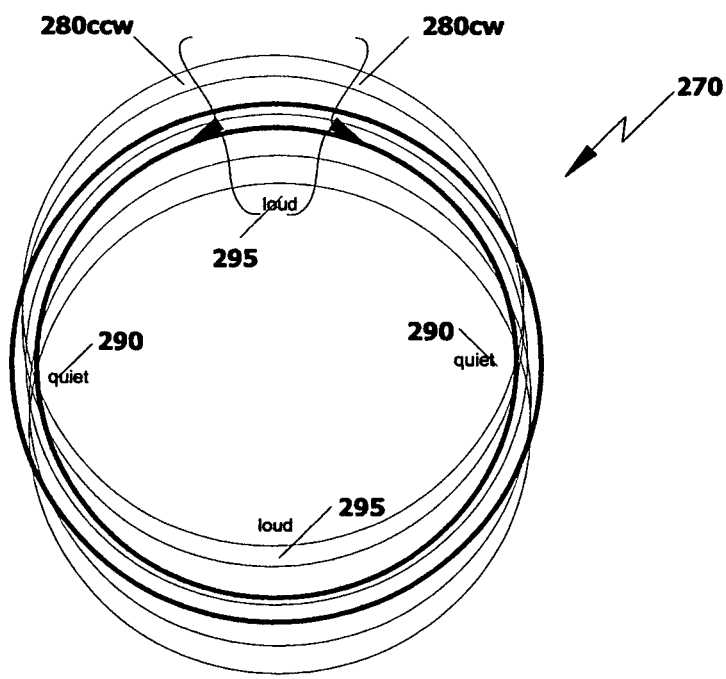
*Prior Art- Fig. 10b*

FORCE-MODE DISTRIBUTED WAVE OSCILLATOR AND AMPLIFIER SYSTEMS

BACKGROUND

All references cited in this specification, and their references, are incorporated by reference herein where appropriate for teachings of additional or alternative details, features, and/or technical background.

Disclosed are an electronic oscillator and amplifier systems that provides accurate multiple phases of an oscillation. Oscillation, in electrical sense, can be defined as repetitive variation of voltage or current in time, which can then be used as signals to accomplish certain tasks, say in electronic devices such as mobile phones. Though prior art is abound with many different types of multiple-phase oscillators used as a source of timing signals for many electronic systems such as microprocessors, network processors, wireline/wireless transceivers and other data communication circuits, they generally suffer from unwanted irregularities in the amplitude and/or frequency of these signals. Even the slightest irregularities may become quite significant in very high-frequency high-accuracy type electronic circuitry. The presently disclosed traveling distributed wave oscillator and amplifier systems can mitigate not only these types of unwanted discrepancies, but they can also sustain the oscillations indefinitely by a judicious use of high resolution oscillator phases without the need for an auxiliary trigger oscillator as described later in the embodiments of a force-mode distributed wave oscillator.

Generally, there are two main types of electronic oscillators that produce repetitive electronic signals: the harmonic oscillator and the relaxation oscillator. The harmonic oscillator produces a sinusoidal output. The basic form of a harmonic oscillator is an electronic amplifier with the output attached to a narrow-band electronic filter, and the output of the filter attached to the input of the amplifier. When the power supply to the amplifier is first switched on, the amplifier's output consists only of noise. The noise travels around the loop, being filtered and re-amplified until it increasingly resembles the desired signal. The relaxation oscillator is often used to produce a non-sinusoidal output, such as a square wave or sawtooth. The oscillator contains a nonlinear component such as a transistor that periodically discharges the energy stored in a capacitor or inductor, causing abrupt changes in the output waveform. Square-wave relaxation oscillators can be used to provide the clock signal for sequential logic circuits such as timers and counters, while the sawtooth oscillators can be used in the time-based circuits that generate the horizontal deflection signals for cathode ray tubes in analogue oscilloscopes and television sets.

Most conventional electronic oscillator circuits use two reactive components, an inductor and a capacitor to create a resonant circuit, in an ideal case indefinitely transferring the energy from one to the other. However, in reality, the loss mechanisms associated with these reactive devices (can be modeled as resistance (R) and/or transconductance (G) elements) require active amplifying circuitry to compensate for these losses. The classical implementation for such an active compensation circuit is negative resistance circuit formed by cross-coupled active devices. A well-known MOSFET (Metal-oxide Semiconductor Field Effect Transistor) implementation of this configuration is shown in FIGS. 1a-1b and FIG. 2. The resultant oscillation frequency is given by the well-known relationship $$f_{osc} = \frac{1}{2\pi\sqrt{LC}},$$

where L is the inductance of inductor 30 and C is the capacitance of capacitor 40 of the so-called L-C tank oscillators 10 and 80 shown in FIGS. 1a-1b. The parasitic resistance R 20 associated with inductor 30 and the parasitic conductance G 50 associated with capacitor 40 results in losses in the tank-oscillators 10 and 80 of FIGS. 1a-1b, respectively that need to be compensated through cross-coupled inverting amplifiers 60 and 70 shown in the same FIGS. 1a-1b. In a CMOS (Complementary Metal-Oxide Semiconductor) technology, an inverting amplifier is implemented by connecting the drains and gates of a PMOS and an NMOS transistor together, resulting in a well-known oscillator circuit 80 shown in FIG. 1b, where 90 provides power supply potential ($V_{DD}$). The devices 70 and 70' of circuit 80 in FIG. 1b correspond to the inverting amplifier 70 of circuit 10 in FIG. 1a, whereas the devices 60 and 60' of circuit 80 in FIG. 1b correspond to the inverting amplifier 60 of circuit 10 in FIG. 1a.

Since the transmission lines are effectively distributed LC structures, distributed LC-oscillators can be constructed using transmission lines of which FIG. 2 is exemplary. A transmission line is, in general, parallel running conductors separated by a dielectric material. Micro-strip line (FIGS. 3a-b), coplanar wave guide (FIGS. 4a-b), coplanar strip line (FIGS. 5a-b), and differential coplanar wave guide (FIGS. 6a-b) are some of the most common transmission line structures. (Similar numerals refer to similar parts shown in FIGS. 3-6. Thus 160, 170, 180 refer to respective signal lines, ground planes and dielectric layers separating the signal layer from the ground plane. Positive and negative signal lines are designated as 160$^+$ and 160$^-$, respectively. Similarly, character (a) references top-view, while character (b) references cross-sectional views of the respective transmission line structures in FIGS. 3-6). Although any of these structures can be used to construct an oscillator, the differentially symmetric ones are more favorable since the opposite phases of a signal are already available (coplanar strip line and differential coplanar wave guide).

Oscillator 100 in FIG. 2 shows an electrical model for a differential transmission line. In the same figure, 110 is inductance of $L_o dz/2$ where $L_o$ is inductance per unit length, 120 is resistance of $R_o dz$ where $R_o$ is resistance per unit length, 130 is differential capacitance of $C_o dz$ where $C_o$ is capacitance per unit length and 140 is differential conductance of $G_o dz$ where $G_o$ is differential conductance per unit length for a differential transmission line stretching in z direction. The inductance per unit length and capacitance per unit length determine the phase velocity of the propagating wave. The phase velocity of a wave is given $$v = 1/\sqrt{L_o C_o}$$

where $L_o$ and $C_o$ are inductance per unit length and capacitance per unit length, respectively. Then, for a given total length of transmission line, the oscillation frequency can be calculated to be $$f_{osc} = \frac{1}{\sqrt{L_{tot}C_{tot}}},$$

where $L_{tot}$ and $C_{tot}$ are the total inductance and total capacitance along the transmission line. As described before, cross-coupled active amplifiers 150 are used to compensate for the conductor and substrate losses. Thanks to the distributed nature of these transmission line oscillators, multiple phases of an oscillation are available along the transmission line, whereas only two 180 deg opposite phases are available in case of a lumped L-C tank oscillators. Distributed Wave Oscillators, Rotary Traveling or Distributed Wave Oscillators, Standing Wave Oscillators are different classes of existing transmission line based oscillators all utilizing the distributed L-C nature of a transmission line structure.

FIG. 7 shows a simplified distributed oscillator of transmission line type 200 with characteristic impedance of $Z_o$. The actual shape can be in any closing geometric form bringing point A to the vicinity of point B so that dashed AC coupled connection 210 can be obtained using a capacitor $C_{bp}$ 220. The reflections resulting from the mismatch of the biasing resistor, $R_{match}$ 230 to the line impedance, $Z_O$, can be significant source of disturbance in the steady-state oscillation waveforms. This affect together with an additional non-ideality due to the bypass capacitor $C_{bp}$ are the main drawbacks of this oscillator technique.

Another transmission line oscillator approach, Rotary Traveling Wave Oscillator technique shown in FIG. 8, avoids this disadvantage by direct cross-coupling 240 of the end points with an additional cost of odd symmetry introduced by this crossing or crossover of the transmission lines. The single-wire closed-loop structure of a Rotary Traveling Wave Oscillator limits the disturbances to one crossover which can still be significant at especially high-frequencies. Once enough gain is provided, there is no latch-up danger for the technique; since it utilizes a single-line DC-coupled closed-loop structure.

Standing Wave Oscillators (SWO) are another group of transmission line oscillators that would utilize transmission line structures. As is known by those skilled in the art, standing waves are formed by superimposing the forward and the backward distributed waves on the same transmission medium simultaneously. The two basic Standing Wave Oscillator topologies, quarter-wave $\lambda/4$ SWO 250 and half-wave $\lambda/2$ SWO 255 are shown in FIGS. 9a-b, respectively. A $\lambda/2$ SWO is basically combination of two $\lambda/4$ SWOs around a center symmetry point, with fundamental operating principle staying the same. In this type of oscillators, the differential transmission line structure is driven by cross-coupled amplifier 150 pair at one end, whereas the other end 260 is shorted. The waves created at the amplifier end 150 are reflected back at the short end 260 causing a reverse propagating wave along the transmission line. In the steady state, the forward and reverse waves coexist, creating standing wave along the line. This would imply amplitude variations in the oscillation phases along the line, gradually diminishing and eventually reaching zero at the short end 260'.

Circular Standing Wave Oscillator (CSWO) 270, shown in FIGS. 10a-10b, is still another standing wave type that would not require any reflection mechanism, but, rather a circular symmetry to create reverse propagating waves along the transmission line medium. As shown in FIG. 10a, the energy is injected into a closed-loop transmission line structure equally and travels symmetrically along the ring in clockwise 280cw and counter-clockwise 280ccw directions. These counter-traveling waves create standing waves with an amplitude profile as shown in FIG. 10b. It will be noted that where the wave components cancel each other a "quiet" node 290 is formed and a "loud" node 295, when the wave components reinforce each other. The energy is injected at two opposite points (A and B) with additional dashed connections 285 to force the main mode. Additionally, at least one of the quiet ports 290 has to be shorted to prevent any latch-up problems. This reduces this structure also to a single-line structure.

It will be known to those skilled in the art that conventional Standing Wave Oscillator structures have a critical drawback of amplitude variations which permits their usage to a limited set of applications. The oscillation phases corresponding to the quite ports would not even exist, compromising the main advantage of transmission line oscillators. In order to provide, therefore, an electronic oscillator circuitry that can provide invariant multiple phases of an oscillation in an uninterrupted manner, a recent U.S. Pat. No. 7,741,921 by one of the inventors of the present disclosure describes a Trigger-Mode Distributed Wave Oscillator System. An auxiliary oscillator is used to trigger and oscillation on independent conductor loops of rings forming a differential transmission medium for the oscillation wave. Once the oscillation was be is triggered, the auxiliary oscillator can be powered down to turn it off, and the wave can sustain itself indefinitely through active amplifying devices which can compensate for losses in the conductors. What is needed, however, is a less complicated system of improved functionality which also can readily lend itself to enhanced beam forming amplification systems.

REFERENCES

U.S. Pat. No. 7,741,921 describes a Trigger-Mode Distributed Wave Oscillator System. An auxiliary oscillator is used to trigger and oscillation on independent conductor loops of rings forming a differential transmission medium for the oscillation wave. Once the oscillation is triggered, the auxiliary oscillator can be powered down to turn it off, and the wave can sustain itself indefinitely through active amplifying devices which can compensate for losses in the conductors.

U.S. Pat. No. 7,242,272 discloses methods and apparatus involving semiconductor devices based on coplanar strip lines (CPS). In one example, high-speed microelectronic devices based on coplanar stripline implementations support differential signals in a range of approximately from 1 Gigahertz to at least 60 Gigahertz. In one aspect, CPS-based devices incorporate various features that increase the quality factor Q of the resulting device. In another aspect, an enhancement of the quality factor Q is achieved while at the same time reducing the phase velocity of one or more waves propagating in the device, thereby also facilitating the fabrication of relatively smaller devices. In still another aspect, a tapered coplanar stripline configuration results in position-dependent line parameters, which may be exploited to achieve significantly high-Q devices. Examples of CPS-based devices incorporating such features include impedance matching devices, devices for power combining and division, delays, resonators, oscillators, filters, amplifiers, mixers and the like, including CMOS-based implementations of such devices.

U.S. Pat. No. 7,161,438 describes an electronic circuitry for generating and distributing standing wave clock signals. The electronic circuitry includes one or more two-conductor transmission line segments that are interconnected with an odd number of voltage-reversing connections to form a closed loop. A regeneration device is connected between the conductors of the transmission line segments and operates to establish and maintain a standing wave on the loop. At any location on a segment there is a pair of oppositely phase oscillations.

U.S. Pat. No. 5,640,112 teaches A clock signal distributing system supplies clock signals exhibiting extremely matched phases as a standing wave without employing extra signals such as a reference signal and the like other than clock signal itself. The system compensates for a phase lag in clock signal sand attenuation in signal amplitude. As a result, clock signals exhibiting extremely matched phases are supplied up to the places to be distributed at the respective terminals without requiring equal-length wiring on, for example, a semiconductor chip. The clock signal distributing system is composed of an electromagnetic transmission path line which transmits periodic clock signals as a standing wave, an amplifier, and a phase advancing unit which advances phases of the periodic clock signals wherein a phase lag in transmission of clock signals and a phase lag in amplitude of the amplifier are corrected in the phase advancing direction by the phase advancing unit.

U.S. Pat. No. 5,584,067 discloses a dual traveling wave resonator filter including a microstrip line to receive an input signal at a first end and first and second traveling wave resonator rings. Each traveling wave resonator ring is in close proximity to the microstrip line such that first and second resonant first combined signals are induced, respectively, in each of the first and second traveling wave resonator rings in response to the input signal on the microstrip line. A band-reject signal is rejected from the microstrip line and a pass-band signal is produced from the microstrip line at a second end.

U.S. Pat. No. 4,749,963 shows a high frequency oscillator comprising a ring type inductive resonator of a microstrip line constituted in a rectangular or annular loop. Capacitors are serially connected to both ends of the line, thereby improving the low-noise, separation and stability characteristics by use of the steep-phase characteristic of the ring-shaped resonator.

U.S. Pat. No. 4,686,407 teaches an improved traveling wave ring resonator utilizing only one source of waves. The standard traveling wave ring resonator uses two wave sources phased 90 degrees apart and physically separated by a quarter wavelength to separately excite two equal-frequency standing wave modes which make up a traveling wave. The present invention uses perturbations of the ring resonator to shift the frequency of the standing wave modes, by specified amounts, and to correctly fix their position, to allow a single wave source to properly excite the standing wave modes which comprise a traveling wave. This invention has application to traveling wave ring resonators in acoustics, mechanical devices, and electromagnetic devices, as well as to simply-connected resonators to be excited in rotating wave modes. Specific applications include improved thermoacoustic traveling wave heat engines and pumps, simplified surface wave motors, and energy efficient wave pools for recreational purposes.

U.S. Pat. No. 6,342,820 describes a balanced oscillator comprising a frequency selective circuit and a balanced active circuit coupled with the frequency selective circuit. The frequency selective circuit includes a short circuited quarter-wave paired line. The balanced active circuit comprises a cross coupled differential pair of transistors. The balanced oscillator can be tuned in a number of different ways.

U.S. Pat. No. 6,396,359 teaches techniques and structures for a tunable, distributed, voltage-controlled oscillator (DVCO) across a wide range of microwave frequencies. One type of DVCO implements a tuning circuit that includes a pair of interconnected amplifying transistors and a current source connected to the transistors, such that a differential voltage input to the circuit adjusts the current to each transistor and effectively adjusts the "electrical length" of one of the transmission lines on which the output frequency is oscillating. This, in turn, adjusts the time delay and thus frequency of the signal propagating on the lines across a wide frequency band. In a preferred embodiment, the tuning circuit is balanced with a complementary tuning circuit to effectively adjust the electrical length of the second transmission line in the oscillator. In another technique that provides for coarser, but wider range broadband frequency tuning, the time delay, and thus, frequency, of the DVCO is adjustable by varying the capacitive loading on the transmission lines, by introducing a coupling capacitor between the transmission lines and tuning the intrinsic capacitances of the gain transistors with a dc bias input.

SUMMARY

Aspects disclosed herein include a force-mode distributed wave oscillator (FMDWO) System comprising a transmission line based traveling wave oscillator having one or more independent electrical conductors a plurality of cross-coupled amplifiers distributed along the electrical conductors; the amplifiers cross-coupled to the electrical conductors in parallel to prevent breaking up of signals and hence avoid signal noise while generating high performance multi-phases; a delay-based first force mechanism across at least two electrical conductors forming a cross-coupled dual-track differential transmission medium to prevent latch-up at start-up; the delay-based first force mechanism further comprising one or more inverter amplifiers configured to force inject oscillations into the electrical conductors at predetermined location intervals; a plurality of varactors for tuning frequency of the oscillations; and wherein the oscillations continue uninterrupted with the aid of delay-based injections without depending upon external triggering. Hence, the disclosed structure, unlike existing arts, triggers oscillation in at least two independent conductors rather than single conductor asymmetric twisted structures.

a force-mode distributed wave oscillator (FMDWO) system comprising an electronic medium having at least two independent electrical conductors forming loops for performing the function of two identical transmission lines; a plurality of cross-coupled amplifiers distributed along the electrical conductors; the amplifiers cross-coupled to the electrical conductors in parallel to prevent breaking up of signals and hence avoid signal noise while generating high performance multi-phases; wherein the two identical transmission lines form a cross-coupled dual-track differential transmission medium; geometry-based second force mechanism formed across the electrical conductors; the geometry-based second force mechanism configured symmetrically to form a central portion having signal injection points formed at proximal center of said second force mechanism; the geometry-based second force mechanism further comprising one or more inverter amplifiers configured to force inject oscillations into the electrical conductors at predetermined location intervals in the central portion; a plurality of varactors for tuning frequency of the oscillations; and wherein the oscillations continue uninterrupted with the aid of geometry-based force injections through said one or more inverted amplifiers without depending upon external triggering.

a force-mode distributed oscillator amplifier (FMDOA) System comprising one or more (FMDOA) elements; a single-ended Force-Mode Distributed Wave Oscillator (FM- DWO) having a single conductor as a primary side and further comprising a delay-based first force mechanism; a force mechanism formed across the single conductor forming a radiating antenna element; the force mechanism further comprising a plurality of inverter amplifiers; a pick-up coil surrounding the radiating antenna element forming the Force-Mode distributed Oscillator Amplifier (FMDOA); and one or more the radiating antenna elements configured to form a multi-element phased-array antenna.

a force-mode distributed oscillator amplifier (FMDOA) System comprising one or more (FMDOA) elements; a single-ended Force-Mode Distributed Wave Oscillator (FM-DWO) having a single conductor as a primary side and further comprising a geometry-based second force mechanism; a force mechanism formed across the single conductor forming a radiating antenna element; the force mechanism further comprising a plurality of inverter amplifiers; a pick-up coil surrounding the radiating antenna element forming the Force-Mode distributed Oscillator Amplifier (FMDOA); and one or more radiating antenna elements configured to form a multi-element phased-array antenna.

BRIEF DESCRIPTION OF DRAWINGS

FIGS. 1a and 1b show a conventional Lumped L-C tank oscillator.

FIG. 2 shows a conventional Distributed Oscillator structure using transmission lines.

FIGS. 3-6 show top and cross-sectional views of conventional semiconductor devices comprising a Microstrip line, a Coplanar Wave Guide, a Coplanar Strip Line and a Differential Coplanar Wave Guide, respectively.

FIG. 7 shows a conventional Distributed Oscillator Structure.

FIG. 8 shows a conventional Rotary Traveling Wave Oscillator.

FIGS. 9a and 9b show a conventional quarter-wave and a half-wave Standing Wave Oscillator, respectively.

FIGS. 10a and 10b show a conventional quarter-wave and a half-wave Circular Standing Wave Oscillator structure, and amplitude profile along the structure, respectively.

DETAILED DESCRIPTION

Figure 11:
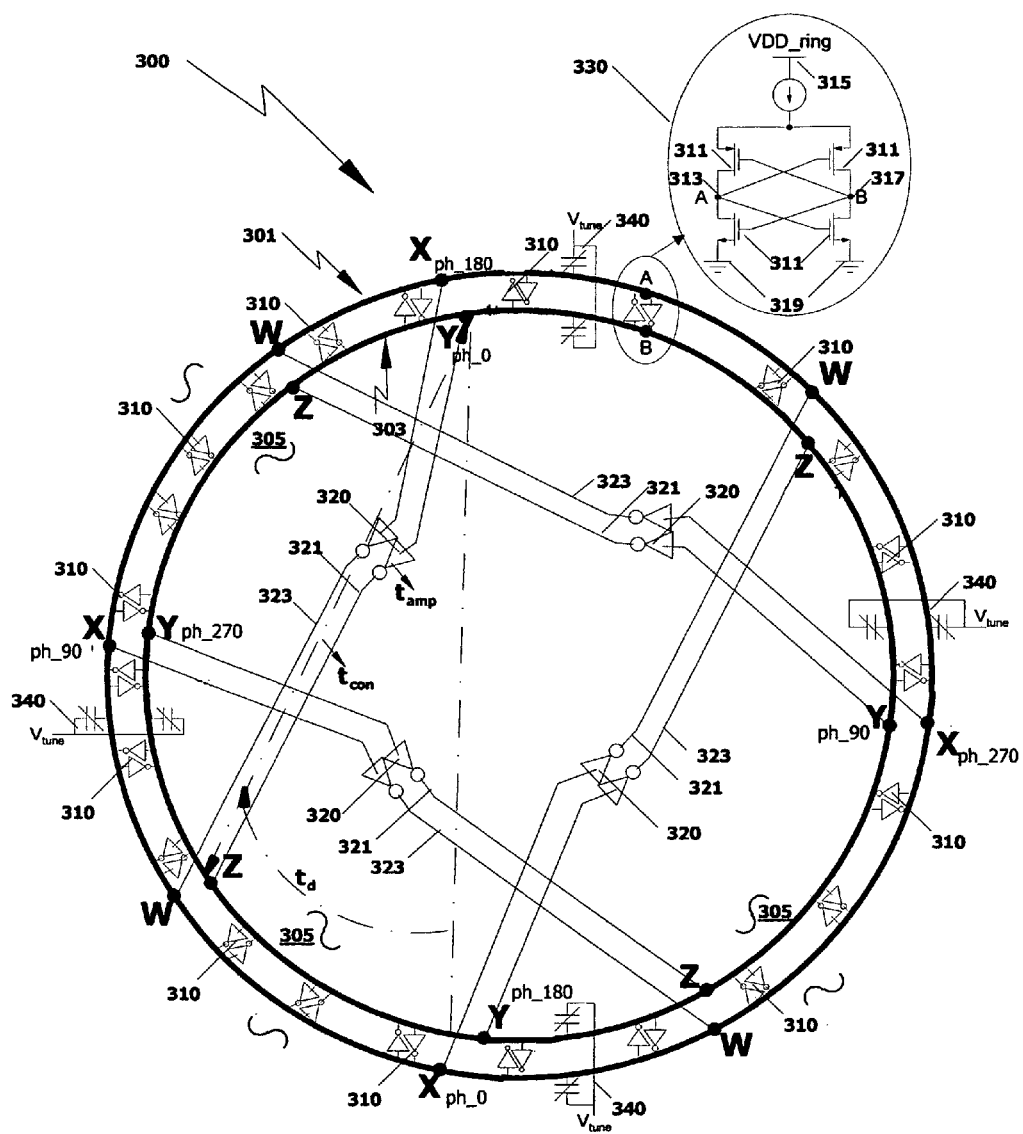
FIG. 11 shows diagrammatically an embodiment of the presently disclosed Delay-Based Force-Mode Distributed Wave Oscillator (FMDWO) having injection forcing inverter amplifiers, finely distributed plurality of cross-coupled amplifiers, and varactors for fine tuning the frequency of oscillations.

In embodiments there is illustrated a force mode distributed wave oscillator (FMDWO) system to provide accurate multiple phases of an oscillation and a force mode distributed wave amplifier (FMDWA) phased-array power amplification system. The electronic oscillator comprises a plurality of independent conductor rings or loops forming a differential transmission medium for sustaining indefinitely a multi-phase oscillation wave initiated without the need for an auxiliary oscillator. The oscillation is initiated across two independent conductor loops by applying a forcing function or force mechanism across each of the individual transmission lines forming a differential transmission medium for the oscillation wave. Thereafter, the disclosed electronic oscillator provides invariant multiple phases of an oscillation in an uninterrupted manner. The cross-coupled distributed inverting amplifiers along these transmission lines boost the differential traveling wave and compensate for the losses along the line to sustain the oscillation without interruptions. Another set of inverting amplifiers at the center of the structure is also used to force opposite signal polarity at the corresponding cross point along the same line. This set of inverting amplifiers at the center of the structure provides the force mechanism that prevents the two complementary conductors from latching up.

In one embodiment, the force mode is implemented through the use of a delay-based mechanism. In another embodiment, the force mode is implemented through the use of a symmetry-based mechanism, as will be explained further below.

In an aspect of the delay-based first force mechanism, signals at certain points along each transmission line are amplified through inverting amplifiers and applied to the corresponding opposite phase points along the same transmission line. The force point is calculated depending on the connecting line delays, as shown below.

In an aspect of the symmetry-based second force mechanism, the differential structure is shaped symmetrically to create a meeting point for the opposite phase points of each conductor in the center of the structure, thus eliminating the inaccuracy of the connecting transmission line delays.

Generally, it is an accepted practice to use single loop oscillators because, contrary to the present disclosure described in more detail below, known art teaches that if more than one loop is attempted, a latch-up will occur, and oscillation will not take place. However, single loops themselves are commonly susceptible to well-known problems caused by asymmetric disturbances due to variances in the nature and number of components, such as amplifiers, terminators and varactors associated with the functionality of the oscillators. On the other hand, the present disclosure teaches a new that a plurality of loops comprising one or more symmetrically independent transmission lines can indeed be used to advantage as a well-behaved oscillator by bringing forward their strengths in eliminating any asymmetric disturbances by virtue of their symmetry with respect to each other, and also by their interactive characteristics to boost each other independently to sustain the wave energy indefinitely while the system is in powered state, as described further below. According to the teachings of the present disclosure, the expected latch-up of multiple loops is circumvented by the use of either the first delay-based or the second symmetry-based mechanism.

Referring now to the drawings, FIG. 11 is illustrative of a Delay-Based Force-Mode Distributed Wave Oscillator Circuit Diagram 300 showing at least two independent transmission lines 301 and 303 formed in the form of a ring, or any symmetric geometrical form, in medium 305. Cross-coupled inverting pair of amplifiers 310 are distributed all along the ring of transmission lines 301 and 303 as shown in the same FIG. 11. The quadrature phases shown in FIG. 11 comprise four phases of ph0, ph90, ph180 and ph270 and are routed to their corresponding locations, such as X, Y, W, Z, along transmission lines 301, 303 in medium 305 with a ring of any symmetrical closed shape, including a triangle, a square, or an octagon, for example. It will be understood that an oscillator with 8, 16 or more number of phases can also be used, routing the available phases to their corresponding locations along the transmission ring medium 305. Energy is injected into the closed-loop transmission lines 301 and 303 equally at uniformly distributed points 330 and travels symmetrically along the ring 305 in a preferred clockwise or counter-clockwise direction as determined by the initiating phases. The start-up energy is provided by VDD-ring 315 and injected at points A 313 and B 317. Since the constituent transmission lines are two independent conductors, there is no mechanism to guarantee traveling wave build-up every time. Thus, during the power-up, the system could latch-up even before any oscillation build-up (i.e. one of the lines could be pulled up to VDD-ring 315 and the other one to GND-ring 319 in the amplifier cell 330 due to the cross-coupled amplifiers 311). However, such a condition can be circumvented according to the present disclosure described hereafter.

Once a traveling oscillation wave is initiated, the inverting amplifiers 310 boost the differential traveling wave and compensate for any losses along the transmission lines 301 and 303 in helping to sustain the wave oscillation. This is accomplished by the inverting amplifiers 310 applying an opposite polarity signal, thus boosting the signal across the other line. However, having only the distributed inverting amplifiers 310 is found to be insufficient to sustain a reliable oscillation since lines 301 and 303 may latch-up during the powering up of the oscillation wave at start-up. It will be known to those skilled in the art that, latch-up means that one line goes high in signal value and the other line low, seemingly in a stable state but with no traveling oscillation wave. In other words, oscillation is not guaranteed at start-up.

In order to overcome this possible undesirable state of latching-up, a delay-based first force mechanism is introduced according to the present disclosure where additional inverting amplifiers 320 are employed that inject signals at predetermined forcing or injection points X, Y in opposite phases at Z, W in order to prevent latch-up. This will be understood by considering the path of a wave (oscillation) traveling 360° around the circular line tracks 301 and 305 shown in FIG. 11. An oscillation wave halfway around either one of the lines would correspond to a 180° wave point of opposite phase. By injecting signals at the appropriate times (based on delay times of connecting transmission lines 321, 323 of FIG. 11, as explained below) at points such as X, Y and delivering the signals via the amplifiers 320 at opposite points Z, W, for example, the signals at Z, W are then forced to assume the opposite polarity to that of at X, Y, and hence prevent the possibility of the signals from staying at the same level of polarity, high or low, causing a latch-up. In other words, a judicious injection of signals of opposite polarity at injection points determined by wave propagation time delays eliminates the other possible state of latch-up, thus leaving the circuit with one possible state, namely a traveling wave having opposite phases at every instant of time, or an oscillation.

In another aspect of the delay-based first force mechanism, in order to obtain an efficient and effective injection, the time delay of the inverting amplifiers 320 and the connecting lines 321 and 323 is accommodated by delaying the signal injection at points X, Y and Z, W in an amount corresponding to the sum of the non-ideal delays. The time delay for the signal injection at pints X, Y is determined from the equation $t_d = t_{amp} + t_{con}$ where $t_d$ is the delay along the traveling wave line (301 or 303), $t_{amp}$ is the inverting amplifier 320 delay and $t_{con}$ is the connecting line 321, 323 delay as shown in FIG. 11. The time delay $t_d$ yields the inverted injection phase to match the traveling wave phase. The application of this compensating offset delay also determines the wave propagation direction since the wave traveling toward the injection point becomes in-phase with the injection signal. Thus, the delay-based first mechanism, forcing opposite polarity signal across the same conductor lines (301, 303) with inverting amplifiers 320 prevents latch-up and forces a traveling wave along the differential lines (301, 303). As is known in the art, varactors 340 shown in FIG. 11 may be used to tune the frequency of the oscillation in order to be able to use the disclosed FMDWO in the initial PLL (Phase-Locked Loop) configuration and also to modulate the oscillator with a baseband data.

Figure 12A:
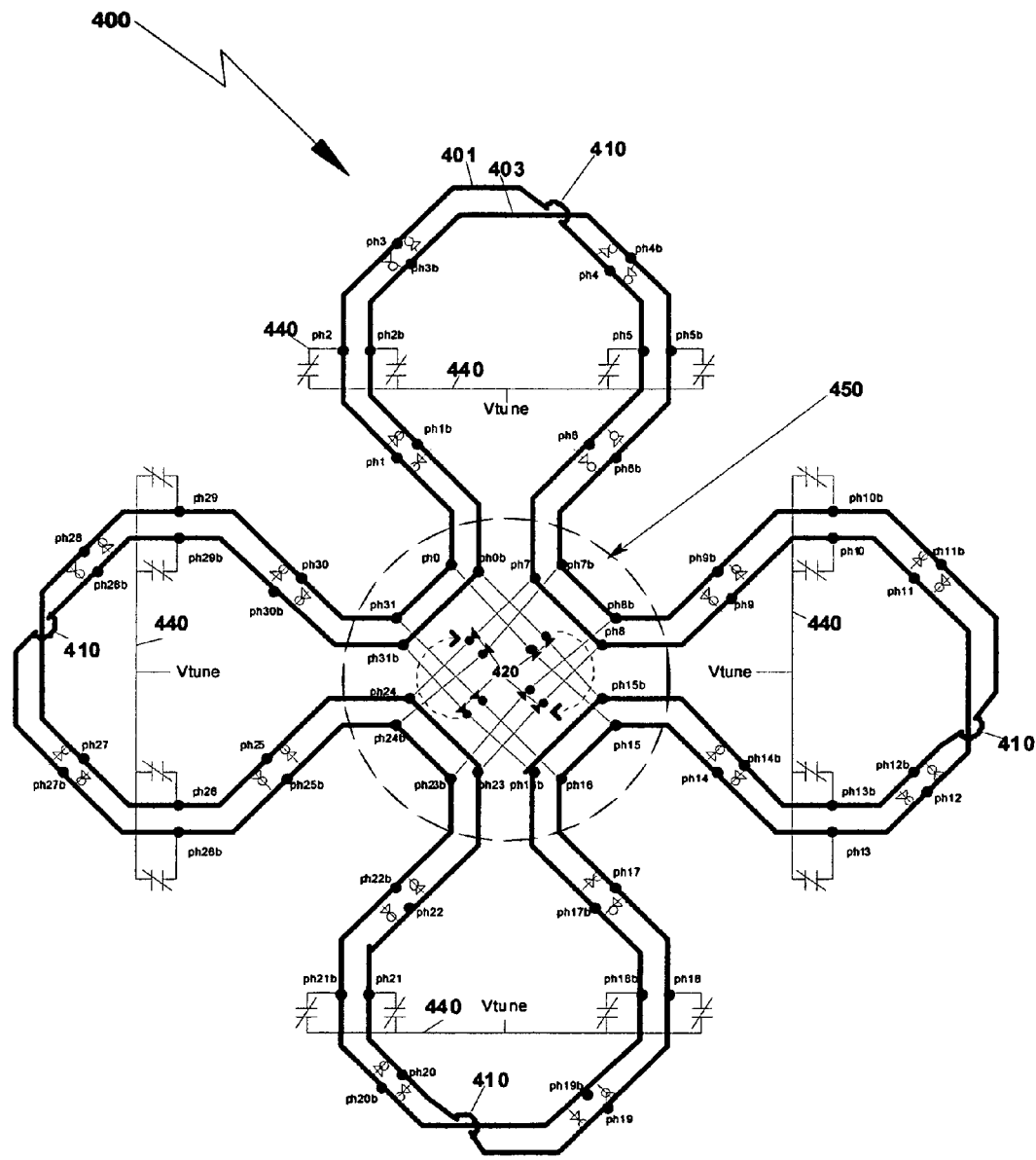
FIGS. 12a and 12b show diagrammatically an embodiment of the presently disclosed Symmetry-Based Force-Mode Distributed Wave Oscillator (FMDWO) having injection forcing inverter amplifiers, finely distributed plurality of cross-coupled amplifiers, and varactors for fine tuning the frequency of oscillations.
Figure 12B:
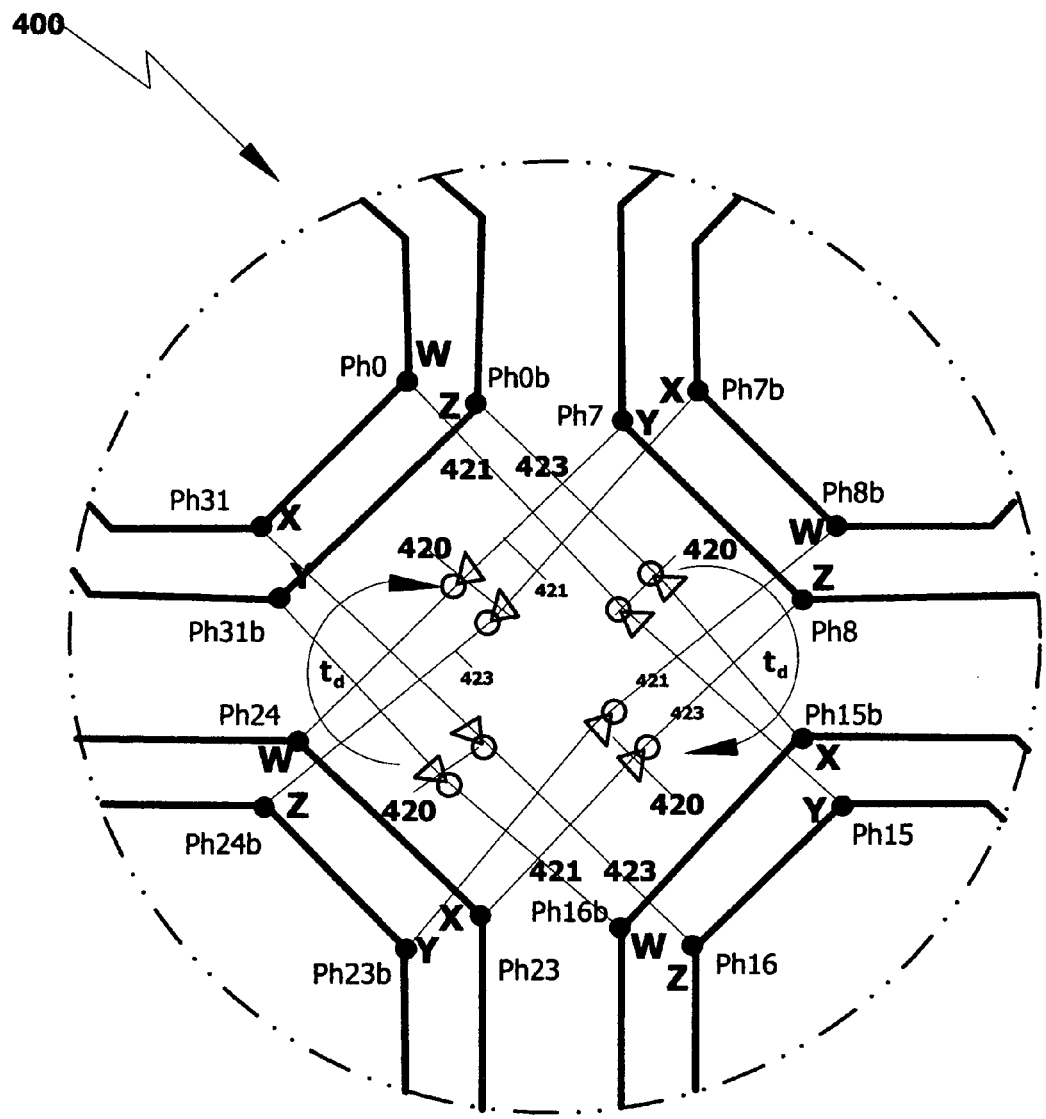

In an aspect of the second force mechanism, namely the symmetry-based force mechanism shown in FIG. 12a, the differential structure 400 is shaped symmetrically to create a meeting point for the opposite phase points of each conductor 401 and 403 in the center 450 of the structure, thus eliminating the inaccuracies in the time delays $t_d$ of the connecting transmission lines 421 and 423, better seen in the enlarged FIG. 12b. In the symmetry based second force mechanism shown in FIGS. 12a and 12b the loop geometry is arranged to bring N injection points into the center of the structure. The 4-point symmetry ring structure is shown in FIG. 12a and carried over to FIG. 12b. The forcing inverting amplifiers 420 are placed across centrally located juncture points X, Y and the corresponding opposing points W, Z eliminating the delays associated with lines 421 and 423 connecting the opposite phase at points X, Y and W, Z. It will be appreciated that in this aspect, the disclosed symmetry-based structure eliminates the connecting line delays $t_{con}$ from the delay equation $t_d = t_{amp} + t_{con}$ cited in relation to the delay-based first force mechanism, thus yielding $t_d = t_{amp}$. The crossings or crossover points 410 of differential lines 401 and 403 are configured at multiple points to ensure the symmetry between the outer 401 and inner 403 conductors. Varactors 440 are used for frequency tuning as in the case with the delay-based first force mechanism described earlier.

Figure 13:
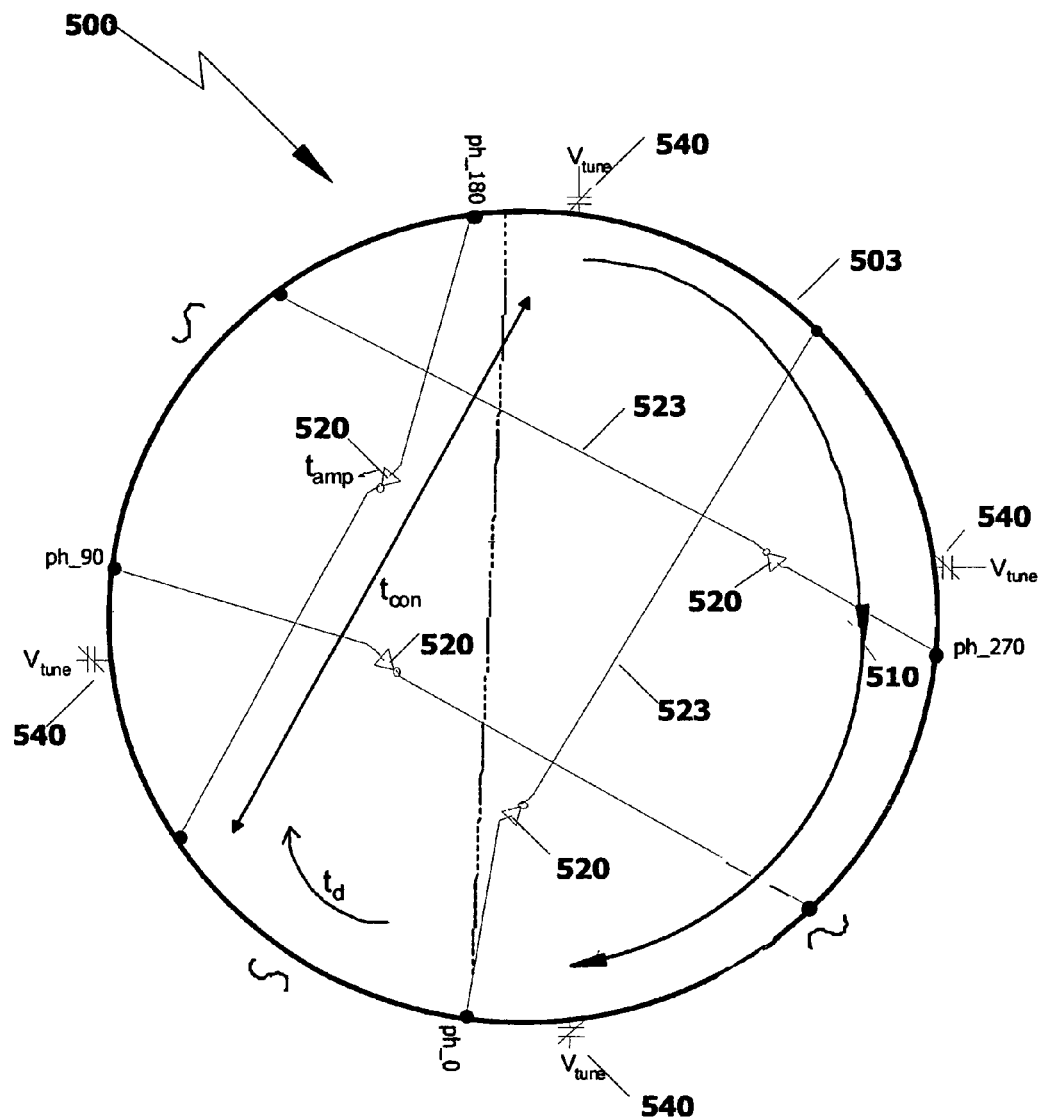
FIG. 13 shows diagrammatically an embodiment of the presently disclosed Single-Ended (FMDWO) forming a radiating antenna (FMDWA).

FIG. 13 shows still another aspect of the presently disclosed Force Mode Distributed Wave Oscillator, namely, a single-ended FMDWO 500. Single-ended because there is a single conductor 503 in contrast to the duo-ended FMDWO of FIGS. 11 and 12a-b with two conductors. The latter FMDWO being fully differential given the two conductors, current of opposite polarity flowing in each of the differential duo conductors will cancel each other out to a first order and, as expected, the fields will be confined locally in the polarized differential structure. In the single-ended FMDWO' 500, however, the resulting unidirectional wave propagation 510, that is, alternating current flow will cause radiation. Consequently, still another aspect is being presently disclosed where an oscillator structure is provided as a radiating antenna element. It will be appreciated that the single-ended structure 500 shown in FIG. 13 utilizes inverter amplifiers 520 judiciously placed as calculated from equation $t_d = t_{amp} + t_{con}$ in order to provide continuous operation without having any latch-up condition; hence, the Force Mode Distributed Wave Antenna, or FMDWA. Using a set of varactors 540, the frequency of the oscillator can be modulated, resulting in a complete transmitter function. It will be understood that the geometry of the loop structure 500 can be arranged into various closed-loop shapes to obtain an optimal radiation pattern (i.e. closed-loop polygon structures such as square, hexagon, octagon, etc. and meandered-path structures)

Figure 14A:
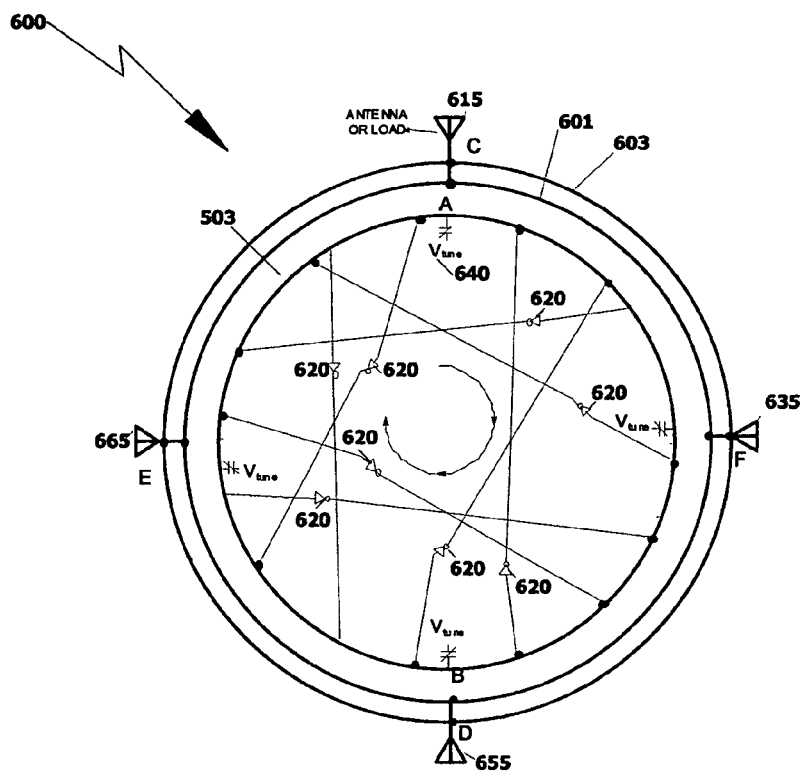
FIGS. 14a and 14b show a Force-Mode Distributed Oscillator Amplifier (FMDOA) having a parallel wave combining configuration, and series wave combining configuration, respectively, according to the present disclosure.
Figure 14B:
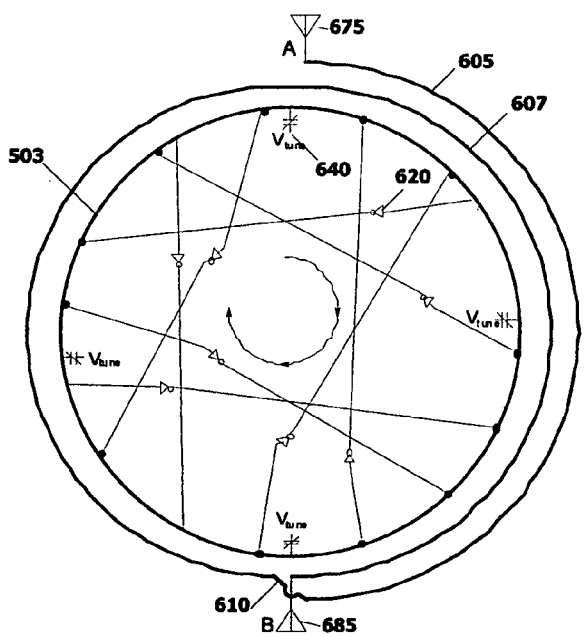

FIGS. 14*a* and 14*b* disclose still another aspect of the use of forcing mechanisms of the first kind (delay-based) or the second kind (symmetry-based) to create a wave combining amplification mechanism and called Force Mode Distributed Oscillator Amplifier. In the structure 600 shown in FIG. 14*a*, a secondary pick-up coil comprising 601 and 603 is formed over single-ended conductor 503 of FIG. 13 resulting in a distributed oscillator-transformer combination driving a separate antenna 615. With the introduction of a secondary side coil (601/603), effective voltage or current amplification is obtained for the antenna drive as shown in FIGS. 14*a* and 14*b*. FIG. 14*a* shows a parallel wave combining architecture those drive four different antennas 615, 635, 655 and 665. FIG. 14*b* shows a series configuration which has one and a half turns 605 and 607 on the secondary side and crossover 640. Additional multiple turns including the half turn can be added to create the opposite phase drives to the two antennas 675 and 685. In that aspect, having two opposite phases driving pair of spatially separated antennas results in a beam formation to affect a more effective transmission in a desired direction. It will be understood that the structure of FIGS. 14*a* and 14*a* are governed by the forcing inverter amplifiers 620 in order to maintain the functionality in the absence of any latch-up condition as described earlier. And the frequency tuning is accomplished by varactors 640 shown in the same figure.

Figure 15A:
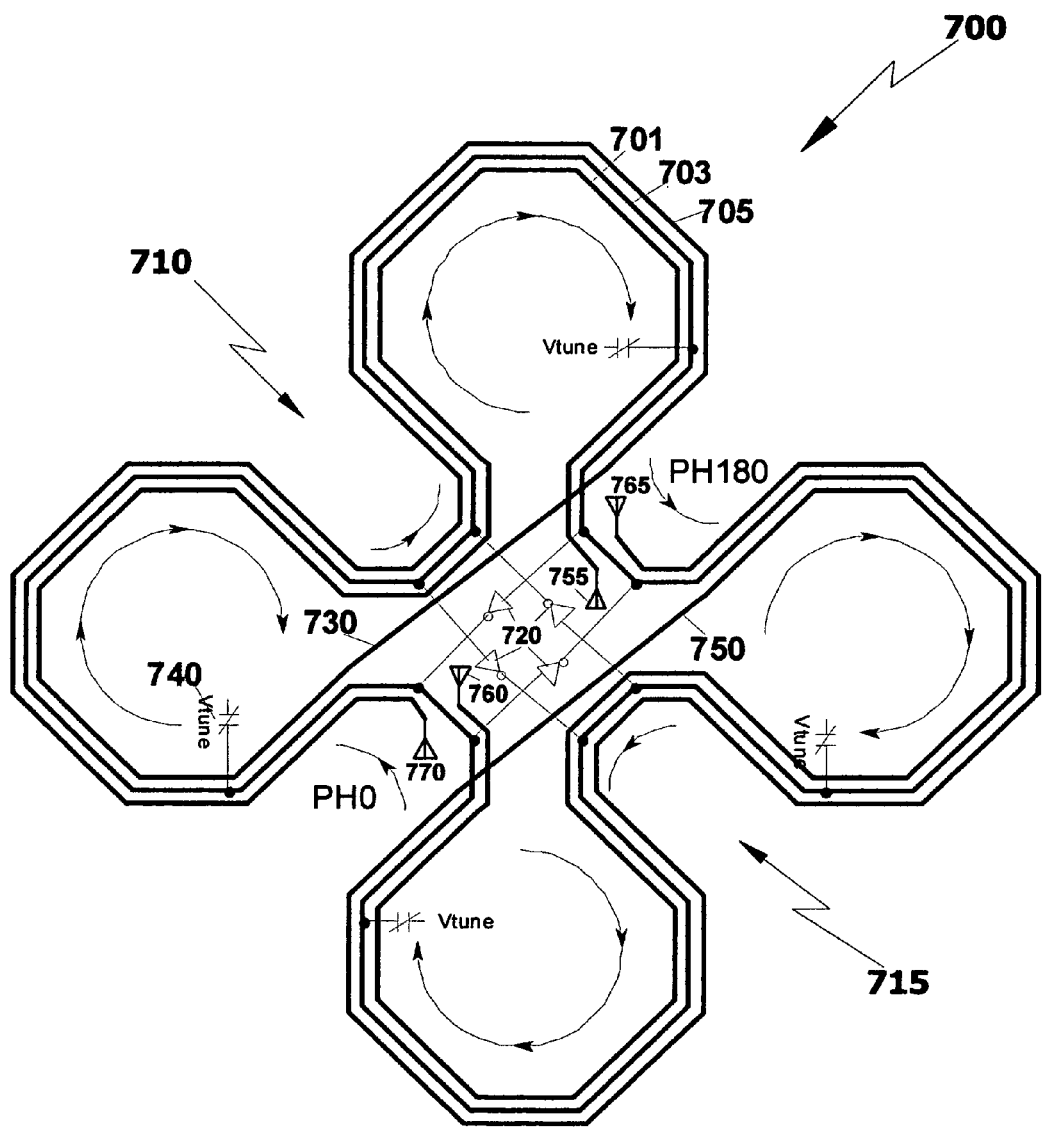
FIGS. 15a and 15b show a Dual Secondary loop (FMDOA) driving antenna loads directly having a two-half loop structures with two antennas each and one full loop structure with two antennas total, respectively, according to the present disclosure.
Figure 15B:
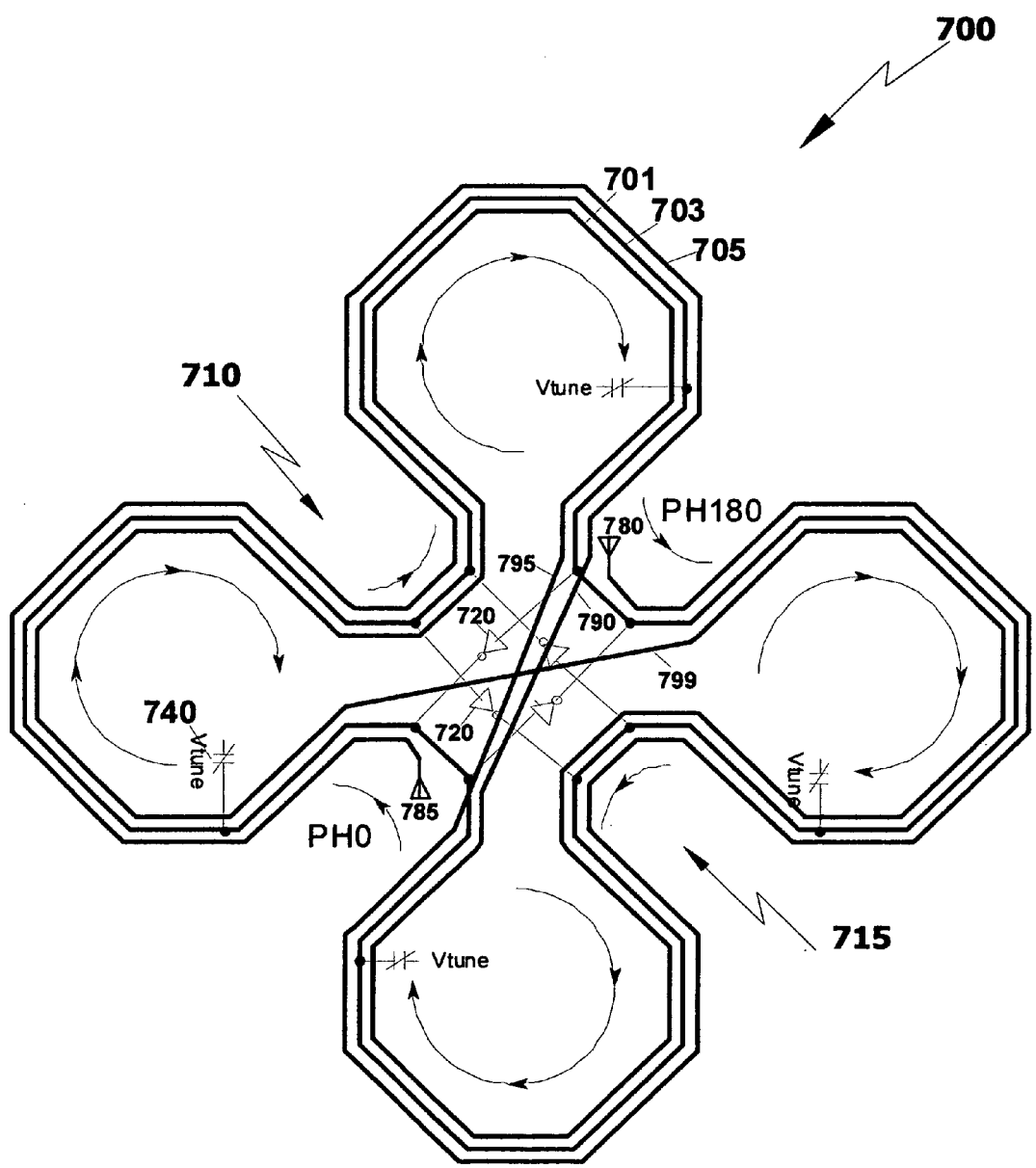

A step-up wave transformation, that is, amplification of oscillating waves can be achieved by allowing a plurality of series turns in the secondary coil using the second symmetry-based approach and multiple crossovers as shown in the structures of FIGS. 15*a* and 15*b*. It will be noted that these FMDOA structures are operationally possible without any latch-up by relying on the forcing function of the inverter amplifiers (with last two digit reference numerals—20) of the present disclosure as described earlier.

Both FIGS. 15*a* and 15*b* show a structure 700 with two symmetric halves 710 and 715 having inverter amplifiers 720, each half including an inner primary line 703 and a two-turn 701 and 705 secondary side coil with crossovers 730 and 750 with respect to each half, where the crossovers connect the end of line 705 with the end of line 701. (As is known in the art, in order to implement a crossover, another metal layer is needed in the substrate for the circuitry.) The final end points in each half 710 and 715 drive two sets of opposite polarity antennas, namely 755, 760 and 765 and 770. Thus, two half loop structures 710, 715 of FIG. 15*a* having two crossovers 730, 750, respectively, provide two antennas each, namely, 755, 760 and 765, 770, with a total of four antennas. One end of secondary side in each half can be grounded, if one antenna for each half is desired.

A structure with full-loop secondary side rather than two-loop secondary structure can be obtained with proper phase crossings at the center as shown in FIG. 15*b*. In this structure shown in FIG. 15*b*, antennas 780 and 785 are connected to the opposite phase end points of the two-turn secondary full-loop comprising lines 701 and 705 and opposite phase crossings 790, 795 and 799. If intended, even more number of turns in the secondary loop yields higher voltage amplification. And in accordance with the present disclosure, the full-loop structure of FIG. 15*b* effectively forces the traveling waves on top of each other to create larger signal amplitudes.

Figure 16:
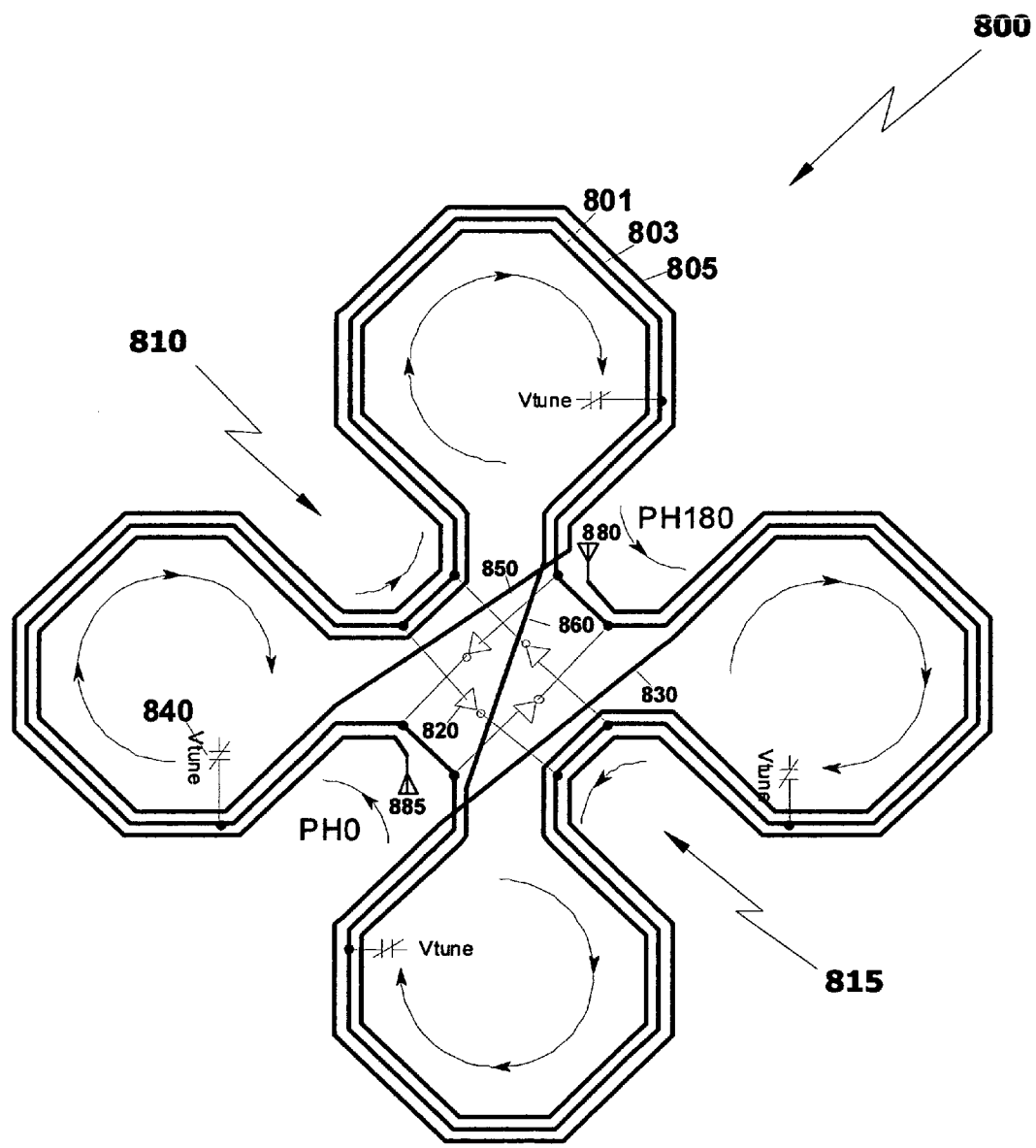
FIG. 16 shows combination of two symmetric secondary cols into a single two-phase structure with center cross connections, according to the present disclosure.

In yet another aspect of the present disclosure, a combination of the half-loop or half-symmetry structure of FIG. 15*a* and the full-loop or full-symmetry structure of FIG. 15*b* yields a single two phase "combo" or combination structure 800 shown in FIG. 16. The disclosed combo structure 800 connects two symmetric multiple-turn halves 810 and 815 of the secondary ring comprising conductors 801 and 805 with a crossover 860 at the proximal center resulting in a similar wave combining voltage step-up transformer. It will be appreciated by those skilled in the art that unlike with classical power amplification techniques, the matching and transformation networks are avoided with the presently disclosed direct antenna drive wave combination, hereafter referred to as Force Mode Distributed Oscillator Amplifier (FMDOA) shown in FIGS. 15*a*, 15*b* and 16. In the FMDOA shown in FIG. 16, the combination is achieved by three center crossovers 830, 850 and 860 and forming two symmetric secondary coils into a single two-phase structure. Starting from one of the antennas, say 880 in FIG. 16, the secondary line coils 801 and 805 around the first half loop 815 twice before cross-connecting via 860 to the other half 810. After a similar two turn around the half 810 it connects to the other antenna 885. The disclosed inverter amplifiers 820 and the frequency tuning varactors 840 as described earlier are also shown.

Figure 17:
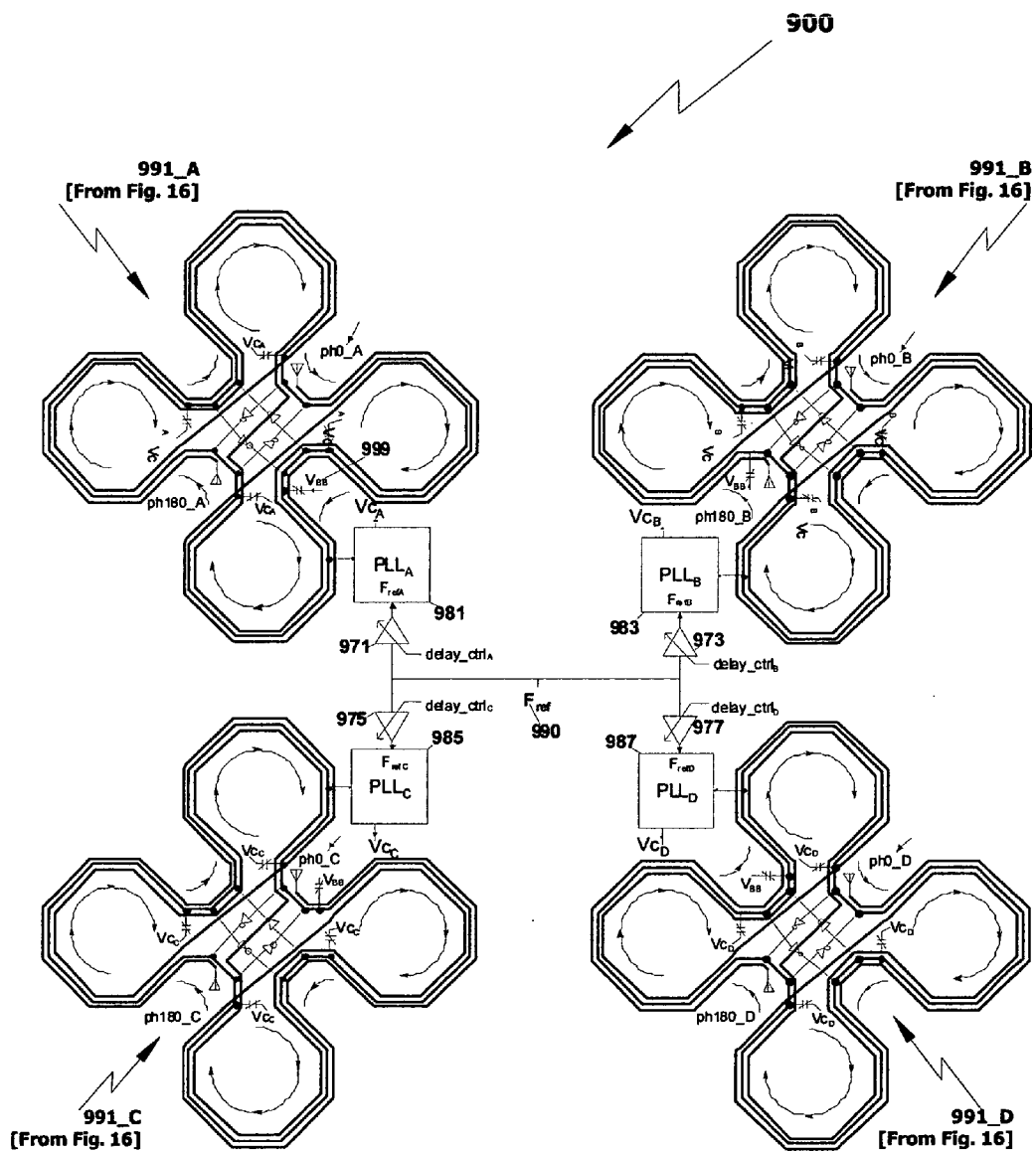
FIG. 17 shows 4 of 2-Loop FMDOAs driving an 8-element antenna array directly, according to the present disclosure.

In still another aspect that is being presently disclosed, a combination structure 900 of FMDOAs of FIG. 16 each with three crossovers 830, 850, 860, two antennas 880, 885 and respective inverter amplifiers 820 is shown in FIG. 17 driving an eight-element antenna array directly. As is known in the art, in high frequency communication systems, the radiation angle from an antenna becomes narrow, necessitating a programmable beam-forming technique to establish a directed link based on the location of the transmitter and the receiver. This is commonly done by driving spatially separated multiple antennas with different phases of the signal (aka Phased-Array Antennas). By changing the phases of the signals driving the antennas, the spatial interference of the waves is also changed, resulting in stronger wave propagation in the corresponding direction.

It is disclosed in FIG. 17 a structure comprising a plurality of four FMDOAs of FIG. 16 which provides programmability for changing the beam direction directly. This is accomplished by locking each one of the FMDOAs 991\_A, 993\_B, 995\_C, 997\_D to a slightly different phase, such as Ph0\_A, Ph0\_B, Ph0\_C, Ph0\_D, respectively, of a reference frequency source 990 using phase-locked loops (PLL) 981, 983, 985, 987 as shown in the same FIG. 17. Programmable delay elements 971, 973, 975, 977 in individual FMDOAs 991, 993, 995, 997, respectively, sets the final phase for each of the corresponding outputs. By changing the delay in each element independently with a fine resolution, fine resolution in the final beam direction is obtained. FIG. 17 shows four (4) of 2-loop FMDOAs forming 8-element antenna array driver. The 2 antenna elements, such as 880 and 885 of FIG. 16. in each of the 4 FMDOAs (hence 8 altogether) are modulated by the same baseband data, $V_{BB}$, 999 serving as the controlling function for the disclosed phase array antenna driver 900 of FIG. 17.

Though these numerous details of the disclosed method are set forth here, such as device parameters, to provide an understanding of the present disclosure, it will be obvious, however, to those skilled in the art that these specific details need not be employed to practice the present embodiments. At the same time, it will be evident that the same disclosed aspects may be employed in other similar cases steps that are too many to cite, such as systems having different symmetry configurations. The aspects of the presently disclosed force-mode distributed wave oscillator include the transmission line based traveling wave oscillator in FIG. 11 technique that involves forcing an oscillation in two independent conductors 301, 303 each using the other one as differential sustainer of the oscillations; that the structure can have any geometric shape, keeping the parallel running conductors symmetric so that speed of the waves in both conductors kept the same; that each transmission line 321, 323 carries opposite traveling waves corresponding to 180° opposite phases along the lines 321, 323; that the structure is a of single-line, "folded" structure and the conductors have no DC or AC connection; and that no triggering is required since additional force mechanisms of inverted amplifiers 320 are introduced. Of the two forcing mechanisms disclosed, it will be noted that the delay-based mechanism in FIG. 11 applies inversely amplified signal to the opposite phase points X, Y, Z, W across the same transmission lines 321, 323 taking into account the connecting line delays ($t_{con}$.) In the geometry, that is, symmetry-based force mechanism the signal injection points are brought together to the proximal center 450 of the structure (FIG. 12a), thus eliminating the inaccuracies introduced by the connecting line delays ($t_{con}$). The disclosure teaches even symmetry without any termination impedances or odd number crossovers, hence no source of amplitude of phase disturbance along the lines. Further, since each of the independent transmission lines 421, 423 of FIG. 12b correspond to a full lap of traveling wave rather than half, using the same total conductor length yields higher oscillation frequency compared to known transmission line oscillator techniques. Each of the parallel running conductors, such as 301 and 303 in FIG. 11, provides all of the oscillation phases, hence the same oscillation phases is available at two distinct locations, such as at X, Y or Z, W in the physical layout of the structure 300. Also, finely distributed varactors 840 are provided to tune the oscillation frequency of phase-locked loop applications as shown in FIGS. 16 and 17. And the disclosed single-ended FMDWO (Force-Mode Distributed Wave Oscillator) can be used as performing the function of a radiating antenna as shown in FIG. 13, which in turn can be configured into a distributed RF-Microwave power amplifier topology as shown in FIG. 16. The system comprising a plurality of such sections each driving a separate antenna, serves as a beam forming transmitter as shown in FIG. 17. The amplifier topology of FIG. 17 forms the basis for FMDOA-based beam forming phased-array technique as an improvement to the present day technology of the same genre.

While the invention has been particularly shown and described with reference to a particular embodiments, it will be appreciated that variations of the above-disclosed embodiments and other features and function, or alternatives thereof, may be desirably combined into many other different systems or applications Also that various presently unforeseen and unanticipated alternatives, modifications, variations or improvements therein may be subsequently made by those skilled in the art which are also intended to be encompassed by the following claims.

What is claimed is:

1. A force-mode distributed wave oscillator (FMDWO) system comprising
    a transmission line based traveling wave oscillator having one or more independent electrical conductors forming at least a cross-coupled dual-track differential transmission medium;
    a plurality of cross-coupled amplifiers distributed along said electrical conductors;
    said amplifiers cross-coupled to said electrical conductors in parallel to prevent breaking up of signals and hence avoid signal noise while generating high performance multi-phases;
    a delay-based first force mechanism formed across at least two said independent electrical conductors to prevent latch-up at start-up;
    said delay-based first force mechanism further comprising one or more inverter amplifiers configured to force oscillations in said electrical conductors;
    a plurality of varactors for tuning frequency of said oscillations; and
    wherein said oscillations continue uninterrupted with the aid of delay-based injections without depending upon external triggering.

2. The system according to claim 1, wherein said two independent conductors form a dual-track differential transmission medium having cross coupling across said two independent conductors structured to receive force injected invariant multiple phase oscillations, each said conductor using the other as a differential sustainer.

3. The system according to claim 1, wherein said delay-based first force mechanism applies inversely amplified signal to opposite phase point ending on a transmission line connected to said electrical conductors at a location interval that takes into account the time interval of travel along said transmission line.

4. The system according to claim 1, wherein said time interval is determined by an equation expressed as $t_d = t_{amp} + t_{con}$, where $t_d$ is the delay along said injected oscillation line, $t_{amp}$ is said inverting amplifier delay and $t_{con}$ is said connecting transmission line delay.

5. The system according to claim 1, wherein said injected oscillations are distributed symmetrically along said independent electrical conductors.

6. The system according to claim 1, wherein said independent electrical conductors carry distributed traveling waves corresponding to 180° opposite phases along said conductors.

7. A force-mode distributed wave oscillator (FMDWO) system comprising
    an electronic medium having at least two independent electrical conductors forming loops for performing the function of two identical transmission lines;
    a plurality of cross-coupled amplifiers distributed along said electrical conductors;
    said amplifiers cross-coupled to said electrical conductors in parallel to prevent breaking up of signals and hence avoid signal noise while generating high performance multi-phases;
    wherein said two identical transmission lines form a cross-coupled dual-track differential transmission medium;
    a geometry-based second force mechanism formed across said electrical conductors;
    said geometry-based second force mechanism configured symmetrically to form a central portion having signal injection points formed at proximal center of said second force mechanism;
    said geometry-based second force mechanism further comprising one or more inverter amplifiers configured to force inject oscillations into said electrical conductors at predetermined location intervals in said central portion;
    a plurality of varactors for tuning frequency of said oscillations; and wherein said oscillations continue uninterrupted with the aid of geometry-based force injections through said one or more inverted amplifiers without depending upon external triggering.

8. The system according to claim 7, wherein said independent conductors are structured to receive force injected invariant multiple phase oscillations, each said conductor using the other as a differential sustainer.

9. The system according to claim 7, wherein said geometry-based second force mechanism comprises symmetry-based mechanism.

10. The system according to claim 7, wherein said geometry-based second force mechanism provides corresponding injection points even-symmetrically formed in said central portion in order to cancel out delays caused by connecting transmission lines thus yielding higher oscillating frequencies.

11. The system according to claim 7, wherein said geometry-based second force mechanism applies inversely amplified signal to opposite predetermined phase points ending on a transmission line connected to said electrical conductors.

12. The system according to claim 7, wherein said independent electrical conductors carry distributed traveling waves corresponding to 180° opposite phases along said conductors.

13. A force-mode distributed Oscillator Amplifier (FMDOA) System comprising
one or more (FMDOA) elements;
a single-ended Force-Mode Distributed Wave Oscillator (FMDWO) having a single conductor as a primary side and further comprising a delay-based first force mechanism;
a secondary pick-up coil surrounding said primary side of said Force-Mode distributed Oscillator Amplifier (FMDOA); and
one or more of said FMDOA elements configured to form a multi-element phased-array antenna driver.

14. The system according to claim 13, wherein said single-conductor primary side Force-Mode Distributed Wave Oscillator comprises a unidirectional (FMDWO).

15. The system according to claim 13, wherein said secondary pick-up coil comprises at least one or more turns.

16. The system according to claim 13, wherein said single conductor forms a primary coil surrounded by said secondary pick-up coil of said Force-Mode distributed Oscillator Amplifier (FMDOA).

17. The system according to claim 16, wherein said Force-Mode distributed Oscillator Amplifier (FMDOA) is configured to convert unidirectional oscillator current in said primary coil into a substantially increased voltage swing in said secondary coil driving an antenna or multiple antennas.

18. The system according to claim 13, wherein only single-ended structure with no differential or secondary conductor form a Force Mode Distributed Wave Antenna (FMDWA).

19. The system according to claim 18, wherein a plurality of said FMDOAs configured in phase-locked loops (PLL) with preferred programmable relative phase difference form a beam forming transmitter.

20. A force-mode distributed Oscillator Amplifier (FMDOA) System comprising
one or more (FMDOA) elements;
a single-ended Force-Mode Distributed Wave Oscillator (FMDWO) having a single conductor as a primary side; and further comprising a geometry-based second force mechanism;
a secondary pick-up coil surrounding said primary side of said Force-Mode distributed Oscillator Amplifier (FMDOA); and
one or more of said FMDOA elements configured to form a multi-element phased-array antenna driver.

* * * * *